United States Patent [19]
Killion

[11] 4,170,720
[45] Oct. 9, 1979

[54] AGC CIRCUIT PARTICULARLY FOR A HEARING AID

[76] Inventor: Mead C. Killion, 935 Wilshire, Elk Grove Village, Ill. 60007

[21] Appl. No.: 883,180

[22] Filed: Mar. 3, 1978

[51] Int. Cl.² ............... H04R 25/00; H03F 1/34
[52] U.S. Cl. ....................... 179/107 R; 330/86; 330/282
[58] Field of Search ............ 179/107 R; 330/86, 282

[56] References Cited

U.S. PATENT DOCUMENTS

| 3,483,475 | 12/1969 | Mitchell | 328/145 |
| 3,769,612 | 10/1973 | Yamazaki | 333/14 |

FOREIGN PATENT DOCUMENTS

| 1243974 | 8/1971 | United Kingdom | 333/14 |

OTHER PUBLICATIONS

Caringella Electronics, Inc., P.O. Box 327, Upland, Calif. 91786, phone 714-985-1540, form ACP-1-169, All Solid State Compressor—preamp Model ACP-1, printed prior to Apr. 9, 1974.

Electronics, Dec. 14, 1962, "Mariner II Instrumentation: What Will it See on Venus?", S. Chase, Jr. et al., pp. 42-45.

Primary Examiner—George G. Stellar
Attorney, Agent, or Firm—Leo J. Aubel

[57] ABSTRACT

A high fidelity hearing aid is disclosed for providing high quality sound and is primarily directed to those users whose hearing loss is such that they need some amplification for low level signals, but do not need amplification for high level signals.

13 Claims, 8 Drawing Figures

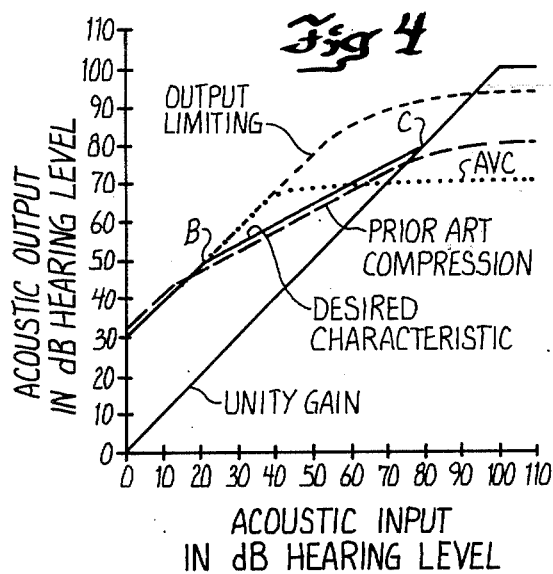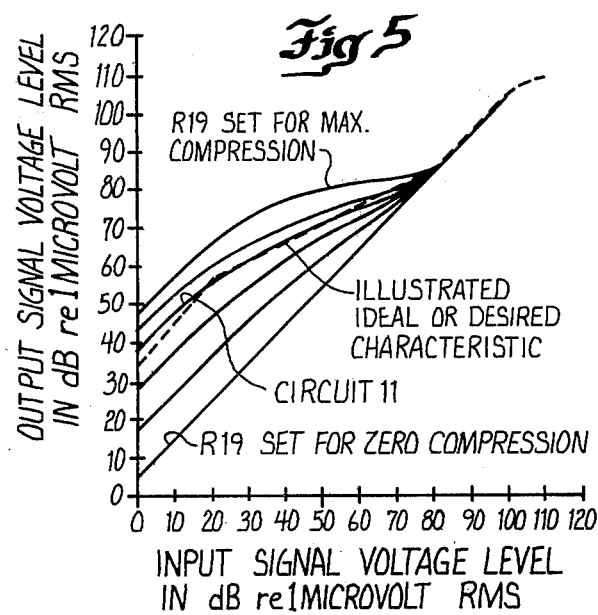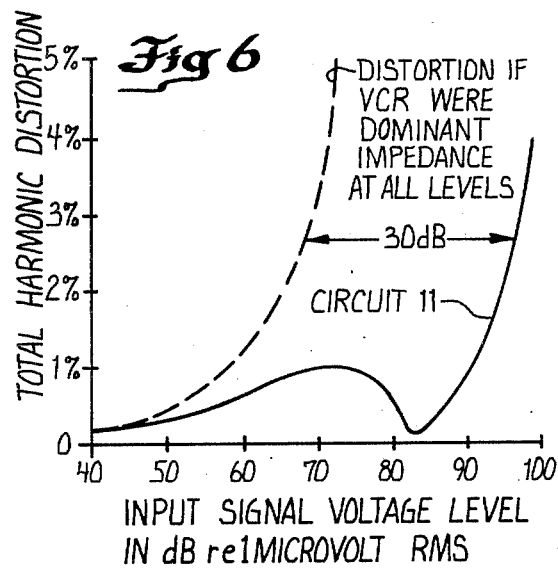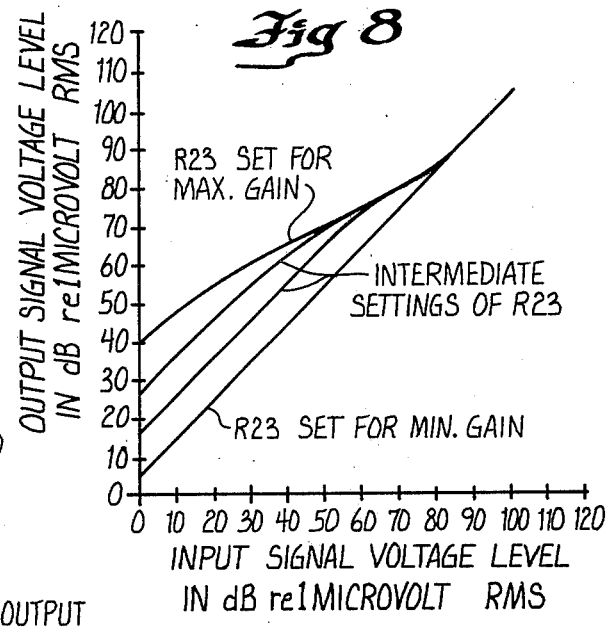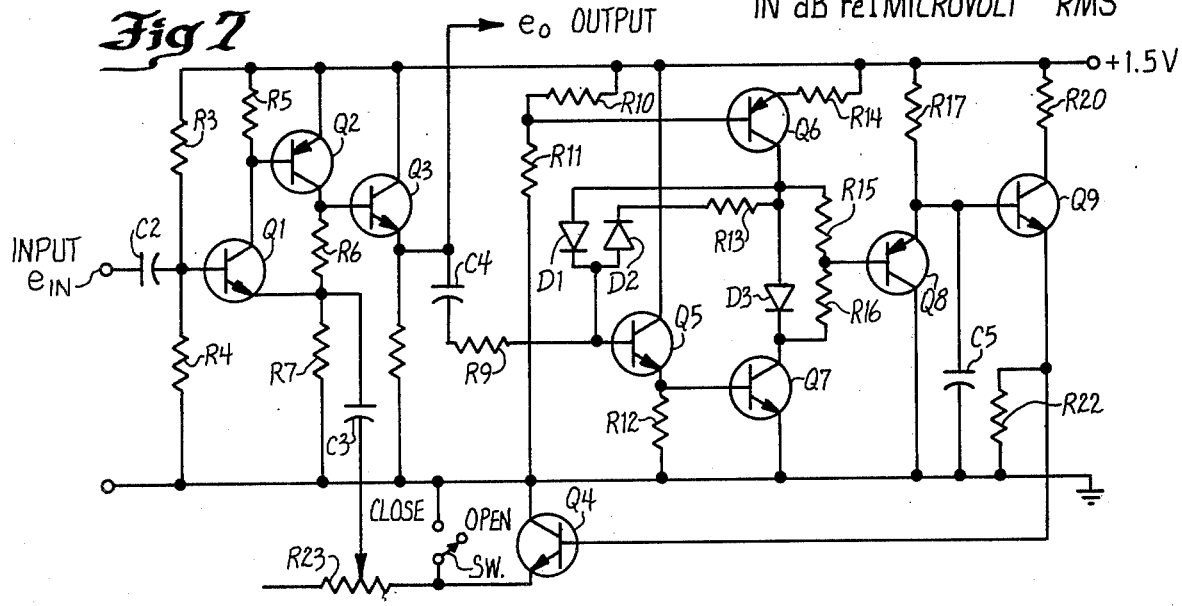

AGC CIRCUIT PARTICULARLY FOR A HEARING AID

BACKGROUND OF THE INVENTION AND STATEMENT OF PRIOR ART

Certain users of hearing aids have a mild to moderate loss of normal sensitivity for low intensity sounds, but retain excellent speech discrimination capabilities and good sound quality judgment capabilities for sounds which are intense enough to be audible to them. This phenomena, commonly referred to as loudness recruitment was, for example, discussed by Steinberg and Gardner in "The Dependence of Hearing Impairment on Sound Intensity", Journal of the Acoustical Society of America, Vol. 9, Pages 11-23 (1937). Accordingly, those hearing aid users who have a hearing impairment characterized by a mild to moderate loss of sensitivity for low intensity sounds require no amplification for high intensity sounds; and, amplification of high intensity sounds will generally cause them discomfort. This problem is well understood in the art, and a variety of solutions have heretofore been employed. However, most of the prior art solutions introduce deterioration in the quality of the delivered sound, so that traditional hearing aids have often been characterized as "low fidelity instruments".

One prior art approach has been to limit the saturation sound pressure output of the hearing aid by means fo a simple peak clipping, which produces large amounts of harmonic and intermodulation distortion. More recently, relatively low distortion compression limiting has been used to limit the saturation sound pressure output of the hearing aid without the introduction of large amounts of harmonic or intermodulation distortion. With either type of output limiting, the saturation sound pressure level out of the hearing aid can be set to a level somewhat below the discomfort level of the user. A typical input-output curve for an output limiting hearing aid is shown in FIG. 4. One disadvantage to the output-limiting approach is that a large percentage of the incoming sounds will be amplified to a point which is near the user's discomfort level.

Another prior art approach has been to use an automatic volume control (AVC) circuit which acts to produce a nearly constant output level for a wide range of input sound pressure levels. In this case, the nearly constant output level can be set to the user's most comfortable listening level, so that the majority of useful sounds are presented at the most comfortable listening level for the user. A typical input-output curve for an automatic volume control hearing aid is shown in FIG. 4. A problem with this latter approach is that the normal dynamic range of the desired sounds is unduly reduced at the output, so that quiet input sounds and background noises are amplified until they appear nearly as loud to the user as loud input sounds. This excessive reduction of the dynamic range lends an unnatural quality to the sound.

A more sophisticated solution provided by the prior art has been the use of wide dynamic range compression amplification wherein the overall gain of the hearing aid is changed smoothly and continuously from a maximum value for low level inputs to a minimum value for high level inputs. Compression hearing aid amplifiers are commercially available which have a nearly constant compression ratio of 2:1 over an input dynamic range of 60 dB or more. With a 2:1 compression ratio, for example, such 10 dB increase in input level causes only a 5 dB increase in output level. An early version of such a compression amplifier suitable for hearing aids was described in U.S. Pat. No. 3,229,049, issued to Hyman Goldberg on Jan. 11, 1966. A typical input-output curve for prior art logarithmic compression hearing aids is shown in FIG. 4. A drawback to such prior art devices, however, is that they provide a compression function characterized by an essentially constant compression ratio for all sound levels up to those sufficiently intense to cause overload of the input circuit, which commonly occurs at microphone input levels corresponding to a hearing level of approximately 80 dB (input sound pressure levels of 90 to 95 dB). For sounds whose sound pressure level exceeds 90 to 95 dB, the overload of the input circuitry causes a rapid increase in amplifier distortion. Since sounds whose peak levels exceed 90 to 95 dB are commonly encountered at concerts, social gatherings, etc., the high distortion levels of such prior art amplifiers renders them unsuitable for use in a high fidelity hearing aid.

Also high quality compression circuits or systems for use in broadcast and recording studio applications are known in the art, see, for example, U.S. Pat. Nos. 3,681,618 and 3,714,462, both to David Blackmer. In these latter systems, the compression ratio and the lower and upper threshold of compression can be readily adjusted by the user to optimize the overall sound quality with different program materials. Such prior art systems have generally required power supply voltages and currents which would be impractical in a head-worn hearing aid; more specifically, power supply requirements of plus and minus 12 volts at a total current drain of 10 mA or more is not uncommon for such prior art systems.

Accordingly, it is a principal object of the present invention to provide a high fidelity hearing aid.

It is another object of the present invention to provide a very low noise, low distortion, variable gain preamplifier capable of handling the unattenuated output of a subminiature microphone without distortion for input sound pressure levels of 110 dB SPL or greater.

It is another object of the present invention to provide a low distortion, low noise, variable compression ratio circuit which requires a supply voltage of 1.5 volts, or less, and a supply current of approximately 100 microamperes, or less.

It is a further object of the present invention to provide a preamplifier whose gain in dB is linearly related to the logarithm of the output signal voltage over an input range of at least 40 dB.

It is yet another object of the present invention to provide a preamplifier circuit with the compression ratio and the maximum gain of the preamplifier adjustable by the user in a simple manner without affecting the ability of the circuit to provide low distortion operation.

A further object of the present invention is to provide a circuit for obtaining wide dynamic range logarithmic compression acting to increase circuit gain for low level signals, in combination with fast-acting, low distortion output limiting compression acting to attenuate the microphone output when output SPL's exceed some predetermined level, and wherein the two separate compression actions do not interact in an undesirable manner.

These and other such objects as may hereinafter appear are attained in the embodiments of the invention shown in the accompanying drawings wherein:

DESCRIPTION OF THE DRAWINGS

FIG. 4 is a group of input-output curves obtained with various prior art circuits as compared to the desirable type of input-output curves and all of said circuits compared with unity gain curve;

The curves of FIGS. 4, 5, 6 and 8 have been labeled fully for ease of understanding.

Figure 3:
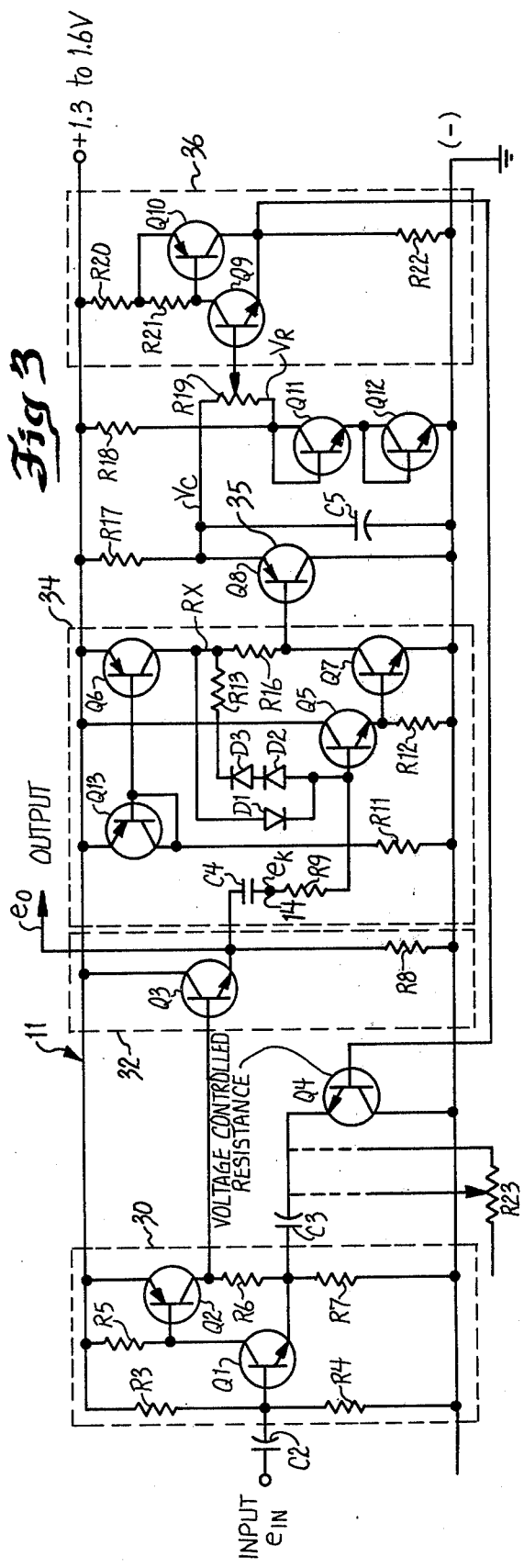
FIG. 3 shows the inventive circuit for providing a continuous range of compression ratio adjustment from 1:1 to 4:1.

FIG. 5 is a family of curves obtained with various compression ratio adjustments of the circuit of FIG. 3;

FIG. 6 is a total harmonic distortion curve of the circuit of FIG. 3 as adjusted for a 2:1 compression ratio;

FIG. 7 is a relatively simplified embodiment of the circuit of FIG. 3 which provides a fixed compression ratio; and, FIG. 8 shows a family of curves obtained with the various settings of the control of the circuit of FIG. 7.

THEORETICAL CONSIDERATIONS

As discussed above, many users with a mild to moderate hearing loss experience essentially normal loudness sensation for sounds above a certain intensity level. Examination of clinical data and the literature indicates that recruitment is typically complete, that is, the loudness sensation is essentially normal, for sounds corresponding to a hearing level of 80 dB or greater. Consider that for speech sounds, an 80 dB hearing level corresponds to a sound pressure level (SPL) in the sound field of approximately 95 dB; and for pure tones, 80 dB hearing level corresponds to approximately 80 to 90 dB SPL in the sound field in the frequency range important for speech perception.

For a minimum degradation in the perceived sound quality, a high fidelity hearing aid should provide sensibly unity acoustical gain over that range of sound intensities in which the user has essentially normal loudness sensations. An ideal high fidelity hearing aid should thus not overload for input sounds above 90 dB SPL, but should produce unity acoustical gain up to the 105 to 115 dB peak sound pressure levels commonly encountered at concerts, social gatherings, etc.

Consider now the low level input-output characteristics required of a high fidelity hearing aid. A gain numerically equal to the user's hearing loss would be required to restore his threshold down to audiometric zero levels; however, such a large amount of gain is commonly found to be unacceptable. A reason for the foregoing is that under most circumstances, the masking produced by the background noise levels commonly encountered in residences, offices, etc. render even those persons with unusually acute hearing incapable of detecting sounds which are less than 15 to 30 dB above commonly accepted audiometric zero levels. Similarly, the upper limit of what is commonly accepted as the range of normal hearing is set at 25 dB above audiometric zero levels. Thus a maximum amplification sufficient to reduce the hearing loss to 15 to 20 dB has been generally found appropriate.

It is readily seen, therefore, that a high fidelity hearing aid designed for minimum degradation in perceived sound quality should typically have a gain-versus-input level which is characterized by a maximum gain which is 15 to 20 dB less than the hearing loss, and is constant for inputs below a 15 to 20 dB hearing levels. Further, such a high fidelity hearing aid should have a gain which decreases smoothly as the input is increased in the range from the 20 dB to 80 dB hearing levels, and has a constant gain of unity (0 dB acoustic amplification) for sounds above the 80 dB hearing level. In practice, it is also generally desirable for the hearing aid to incorporate fast-acting low distortion compression limiting applied to the microphone output for sounds above the 100 dB hearing level (110 to 115 dB SPL). This latter function not only prevents occasional uncomfortably loud sounds from reaching the user, but also functions to avoid any distortion or bias shifts in the amplifier during such sound extremes. An example of the desired gain-versus-input level characteristic discussed above is illustrated in FIG. 4 for an individual with a 45 dB hearing loss. The inflections of "knees" occurring at points B and C in the curve of FIG. 4 will hereafter be respectively referred to as the lower and upper thresholds of compression.

In a hearing aid, a variable compression ratio control is also desirable so that one basic hearing aid design can cover a wide variety of hearing losses in the mild to moderate range and yet, in each individual case, provide the minimum compression ratio required in order for the user to have adequate gain for very low level signals. Moreover, if controls for adjustment of compression ratio are made available, the user can reduce the compression ratio and thus the gain for moderate-level signals when he finds himself in a noisy environment so the environmental noises are not amplified annoyingly. Being able to chose the minimum compression ratio appropriate to each situation is desirable because it generally provides the best overall sound quality.

Experiments using commonly employed speech tests, for example, have shown that 2:1 compression ratio with the characteristics shown in FIG. 4 will provide adequate gain to compensate for a 45 dB hearing loss, and will reduce the 45 dB hearing loss down to approximately 15 dB, which is essentially in the normal range. At the same time, such a 2:1 compression ratio is low enough so that its operation is frequently unobtrusive enough to be nearly inaudible to the untrained listener with normal hearing. For example, in the course of conducting various experiments it was found that when the inventive circuit is inserted in the amplification chain of a home high fidelity system, it makes it possible to enjoy wide dynamic range classical recorded music at comfortable listening levels without the annoyance created when portions of the music drop below audibility due to the masking produced by the noise of household appliances. With the appliances turned off, moreover, casual listeners who have been asked to judge the overall sound quality of the system have, with rare exception, not even noticed the presence of the signal processing provided by the 2:1 compression circuitry.

The applicant believes that the combination of the desirable features discussed above in a low power, low noise circuit suitable for use in head-worn hearing aids is new in the art. More particularly, the inventive circuit provides low distortion, low noise, variable compression ratio operation while requiring a supply voltage of only 1.5 v or less and consuming approximately 100 microamperes of supply current. The circuit disclosed herein provides less than a 1.5 micro volt input noise level with various setting of the compression ratio including a setting of 1:1 which corresponds to a fixed gain or unity gain condition, while introducing a total harmonic distortion of 2%, or less, for any input signal voltage between 1 micro volt and 60 millivolts rms and for any compression ratio setting between 1:1 and 3:1. The present circuits produce a total harmonic distortion below 5% even with an input signal voltage as high as 100 millivolts. Thus, it is seen that the present circuit provides an undistorted input dynamic range, that is, the range between the input noise level and the input overload level, of nearly 100 dB.

DESCRIPTION OF THE INVENTION

Figure 1:
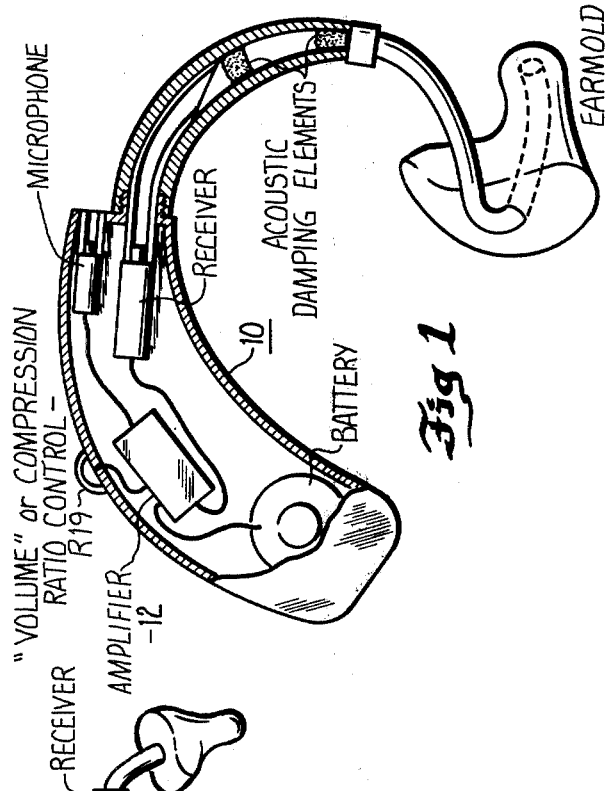
FIG. 1 shows a high fidelity hearing aid incorporating the inventive circuit in accordance with the invention.

FIG. 1 is a view partly in cross section of a high fidelity hearing aid 10 in accordance with the invention. As will be appreciated, the structure of the high fidelity hearing aid 10 may include the usual microphone, receiver and battery mounted in the hearing aid housing. The hearing aid 10 may include acoustic damping elements in the conduit coupling the output of the receiver to the ear mold and thence to the ear of the user. High fidelity hearing aid 10 also includes complete amplifier 12 as shown in FIG. 2, which includes the variable compression ratio amplifier 11 in accordance with the invention which is shown in more detail in FIG. 3.

Figure 2:
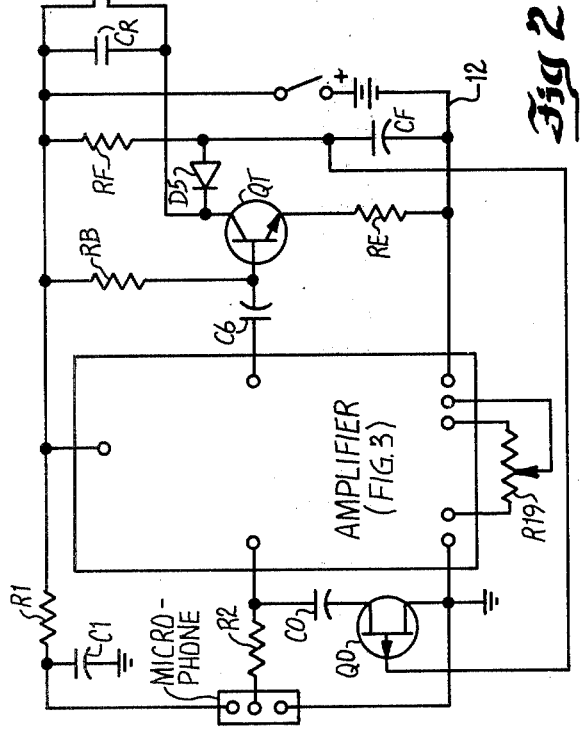
FIG. 2 shows certain circuits for interfacing the inventive circuit with the microphone and receiver of the hearing aid of FIG. 1.

FIG. 2 shows the complete amplifier circuitry 12 for adapting or interfacing the inventive circuit with the microphone and receiver of the high fidelity hearing aid 10, as will be described more fully hereinbelow.

Refer now to FIG. 3 which shows a schematic diagram of a preferred embodiment of the invention. A listing of the values of the various components or elements of the circuit 11 of FIG. 3 follows the description of the operation of the circuit.

In FIG. 3, a signal $e_{in}$ as from a microphone is coupled through a series connected capacitor C2 to an amplifier 30 comprising transistors Q1 and Q2. An important feature of circuit 11 is the feedback network provided by resistors R6 and R7 and transistor Q4 connected in an inverted configuration to provide an impedance in the feedback circuit configured as a voltage controlled resistance (VCR) element.

A brief explanation of the function of the VCR in the inventive circuit 11 is now in order. In the desired range of operation, the AC resistance of the VCR transistor goes from a few hundred ohms to over 1 megohm and the resistance is an approximately inverse exponential function of the control voltage. A small signal AC resistance of about 100,000 ohms associated with the DC control voltage of 400 mV, with a 10-fold decrease in AC resistance resulting from each 60 mV increase in control voltage, is typical of some devices. This predictable inverse exponential control characteristic allows a simple implementation of a logarithmic compression gain control function, as is well known.

In the circuit of FIG. 3, the VCR transistor is placed in shunt with resistor R7 for AC currents by means of the coupling provided by low impedance capacitor C3. When the AC resistance of the VCR is high (1 megohm for example), its shunting effect on R7 will be minimal and so the gain of amplifier 30 will be determined by the values of feedback resistors R6 and R7. In the preferred embodiment, R6 and R7 are equal valued resistances, and the voltage gain of amplifier 30 is approximately 6 dB under these conditions. When the AC resistance of the VCR is low (a few hundred ohms, for example), on the other hand, its shunting effect on R7 will be maximal and the gain of amplifier 30 will be maximum. In the preferred embodiment, a maximum gain for amplifier 30 of about 46 dB is obtained with a control voltage of approximately 600 mV applied to the VCR transistor Q4.

It has been found that the nonlinearity of such a VCR element tends to introduce undesirable distortion as the AC voltage is increased, see FIG. 6. With a 1.5 mV rms AC sine wave, for example, a 1.5% total harmonic distortion results, which is about the upper limit for a high fidelity instrument. Accordingly, to maintain a low distortion, the AC signal could be limited to a maximum 1.5 millivolts across the voltage controlled resistance (VCR) when the VCR is a controlling resistance in the circuit operation. A disadvantage to this approach in a hearing aid, is that if the microphone output level is attenuated by the 32 dB required to bring the 60 mV (110 dB SPL equivalent) levels down to 1.5 mV, the intrinsic noise level of the circuitry will become objectionable with low level inputs. It is, therefore, not advisable to substantially lower the microphone level and subsequently amplify it after coupling to the VCR. In order to redude the deleterious effect of preamplifier noise levels, it is desirable to obtain the highest possible signal voltage levels out of the microphone, but in order to reduce the deleterious effect of nonlinear distortion at high levels, it is desirable to attenuate the signal voltage levels applied to the VCR.

The inventive circuit 11 provides a solution to the foregoing problem by biasing the nonlinear voltage controlled resistance (VCR) element into a sensibly nonconducting state under high input signal level conditions, and bringing the VCR into effective operation only under low level input conditions. Thus under high input signal voltage conditions, where the nonlinearity of the VCR transistor Q4 becomes evident, only a negligable portion of the signal current flows through VCR transistor Q4 while the main port of the signal current flows through (linear) resistor R7. Thus, the large signal nonlinearity of the VCR has only a negligable effect on the operation of amplifier 30. Furthermore, a maximum of negative feedback is applied around amplifier 30 under high signal level conditions so as to further minimize the effect of the nonlinearities in the amplifier transistors Q1 and Q2. Under low input signal voltage conditions, on the other hand, the operation of transistors Q1 and Q2 and the AC resistance of VCR transistors Q4 are all sensibly linear, so that undistorted operation of amplifier 30 is obtained even under maximum gain conditions (i.e., even when the shunting effect of transistor Q4 on feedback resistor R7 is maximal). With this approach, an undistorted dynamic range improvement of 30 dB or more may be obtained over that obtained when the VCR remains the controlling element at all signal levels as shown in FIG. 6. Note in FIG. 6 that the distortion of circuit 11 is 1% or less for AC inputs up to 30 mV, and less than 5% with 100 mV inputs. Careful listening tests indicate that the amount of harmonic distortion introduced by the operation of circuit 11 (and illustrated in FIG. 6) is undetectable, even to a trained listener, under most listening conditions.

Return now to the description of the circuit of FIG. 3. The signal from amplifier 30 is coupled from transistor Q2 to an AC buffer amplifier 32 comprising transistor Q3 and resistor R8. The emitter of transistor Q3 is coupled through capacitor C4 and resistor R9 to the base of transistor Q5 of logarithmic amplifier 34 to provide a low impedance drive voltage for the amplifier 34. The logarithmic amplifier 34 includes transistors Q13, Q5, Q6, Q7 and diodes D1, D2 and D3. The emitter of transistor Q3 also couples an output to the amplifier of the associated hearing aid or other device as indicated.

The logarithmic AC amplifier 34 has a very high input impedance and roughly 60 dB of open loop gain. The diode D1 connected in parallel with diodes D2 and D3 and resistor R13 functions as a nonlinear feedback impedance which in cooperation with the input resistor R9 provides a closed loop gain which is related to the input signal voltage $e_{in}$ in such a way that the peak voltage at the collector of Q7 is proportional to the logarithm of the peak AC voltage $e_k$ developed at the junction 14 of the capacitor C4 and resistor R9. The voltage at the collector of Q7 will have a DC resting value of roughly 850 mV DC with an AC input of 0.3 mV or less and a negative going AC peak value which increases logarithmically at a rate of approximately 220 mV for each factor of ten increases in input signal voltage $e_k$.

With low values of resistor R13, this nearly exact logarithmic relationship exists over a 60 dB range of AC input voltages $e_k$ extending from a 0.3 mV to 300 mV. With higher values of resistor R13, a deviation toward linear operation is obtained at higher input levels. The foregoing deviation makes possible a more rapid decrease in control voltage to the VCR once the upper threshold of compression has been reached in order that the nonlinear VCR will have neglible effect on the operation of the circuit 11 at high signal levels.

The sum of the base emitter offset voltages of Q5 and Q7 produces a relatively high DC input voltage so that two series diodes (D2 and D3) rather than one may be used in the feedback loop without incurring the undesirable negative voltage clipping which would otherwise occur due to saturation of transistor Q7. The high sensitivity of the logarithmic amplifier 34 in turn allows a relatively high compression ratio without the need for additional amplification of the control voltage. A wide range of operation combined with a high (220 mV/decade) sensitivity of the logarithmic amplifier 34 is thus made possible for operation with a 1.3 to 1.6 volt supply.

Diode D1 periodically applies an opposite polarity feedback current to that which periodically flows through diodes D2 and D3 in order to prevent a net DC current flow through capacitor C4 which would otherwise produce an undesirable shift in operating bias levels of the logarithmic AC amplifier as the input signal changes from a low to a high level.

Transistor Q8, resistor R17 and capacitor C5 provide a peak detection rectifier 35. Transistor Q8 is used in order to provide a high input impedance so the rectifier 35 does not load down the output of the logarithmic AC amplifier 34. Resistor R17 and capacitor C5 determine the attack and release time of the circuit 11 which, in the embodiment shown, has an attack time of 3 milliseconds and a release time of about 50 milliseconds.

The compression ratio control potentiometer R19 is adjustable to couple a selected portion of the output voltage from the emitter of Q8 in rectifier circuit 35 to the DC buffer amplifier 36 whose output in turn provides the feedback control voltage applied to VCR transistor Q4. The lower terminal of potentiometer R19 is connected to the junction of resistor R18 and transistor Q11. Resistor R18 has its other terminal connected to supply potential, and transistor Q11 is connected through transistor Q12 to ground reference. Accordingly, resistor R19 may be adjusted so that a reference voltage VR, which is sensibly independent of the rectifier output voltage VC at the emitter of transistor Q8 is coupled through the buffer amplifier 36 to transistor Q4. The reference voltage VR is adjusted to be equal to the DC voltage obtained at the rectifier output when the input signal voltage is equal to the upper compression threshold value. Transistors Q11 and Q12 are preferably chosen to match the characteristics of transistors Q9 and transistor Q4 so that a temperature independent operation may be obtained.

The DC buffer amplifier 36 is formed by transistors Q9 and Q10 and the associated resistors provide a high input impedance, low output impedance, sensibly unity gain amplifier. Buffer amplifier 36 has a DC offset voltage which compensates for the DC offset voltage introduced by rectifier 35. The proper level of the DC control voltage VC is obtained by choice of resistor R16, which can also easily compensate for small differences in these offset voltages.

With the circuit valves listed hereinafter, the circuit of FIG. 3 will provide a maximum compression ratio of nearly 5:1. If a maximum compression ratio of only 3:1 is required, transistor Q10 and resistor R21 may be eliminated from the circuit, and buffer amplifier 36 will have noticeably less than unity gain, thus reducing the maximum compression ratio available in the circuit. Similarly, D1 D2 and D3 may be nongold-doped diodes such as formed by transistors Q11 and Q12 (connected as diodes) when a maximum compression ratio of less than 5:1 is acceptable; in such case it has been found desirable to insert a series resistor at the point labeled RX adjacent resistor R13.

In general, choosing a lower value for the upper threshold of compression will result in reduced distortion at all signal levels. Lowering the upper threshold of compression in the circuit of FIG. 3 or FIG. 7 may be accomplished most easily by reducing the value of R9 and/or increasing the value of R16, followed by appropriate selection of R13 and R18. Conversely, increasing the upper threshold of compression may be accomplished, at the expense of increased distortion levels, by increasing the value of R9 and/or reducing the value of R16.

As mentioned above, transistor Q4 is connected as a voltage controlled resistance VCR. The control voltage from buffer amplifier 36 is impressed across the base to collector junction of transistor Q4. The offset voltage developed across the emitter collector junction in this inverted connection is in the fractional millivolt region and is sensibly unchanging over the range of control voltages which is required to give 40 dB of gain control. An advantage of the low and sensibly unchanging offset voltage is that the control voltage is not mixed in with the signal voltage, so that as the control voltage is changed, it does not introduce any unwanted AC signal resulting in audible "clicks" or "thumps" in the output.

The circuit of FIG. 2 also shows an optional FET Q0 in shunt with the microphone output terminal. Note that resistor R2 may not be required in those cases where the microphone output impedance is itself high enough. The FET Q0 can be used to attenuate the microphone output when the sound level input to the microphone is so high that the linear output capabilities of the amplifier would otherwise be exceeded or the sound pressure level delivered to the user would otherwise be uncomfortable. For example, with a typical hearing aid receiver driven from a Class A output stange, the upper limit of linear operations of the Class A output stange may correspond to 110 dB SPL. Moreover, low current drain hearing aids often reproduce an undistorted output only up to 105 dB SPL or less. Even though the circuit of FIG. 2 will handle up to the equivalent of 115 dB SPL input, therefore, the associated output amplifier of the hearing aid would distort the signal under those input SPL conditions unless some means such as Q0 were provided to reduce the signal reaching the output amplifier. The AC voltage developed at the amplifier output may be sensed (by means such as shown in FIG. 2), and used to control the AC resistance of Q0 in such a manner as to prevent the above-described difficulties of output amplifier distortion and/or user discomfort. Since the input levels at which such operation will occur are substantially above the upper threshold of compression for the logarithmic compression circuit, undesirable interaction between the two circuit functions is avoided.

The value of capacitor C3 given hereinbelow is chosen so that the frequency response of the preamplifier will be sensible independent of gain over the audio band. By choosing a smaller value for C3, the frequency response will be dependent upon the input signal levels such that the gain and frequency response will be related to the input signal voltage in a continuous manner over a wide range of output levels due to the wide range logarithmic compression operation of the preamplifier. For example, in the circuit shown it has been found that a value for C3 which is 0.05 uf will often provide improved discrimination of speech signals in a background of noise, expecially when the noise has strong low frequency components. Capacitor C3 could be selected, or switched in and out of the circuit, to provide best sound quality for music, or best discrimination as for speech. Such level dependent variation of the frequency response is known in the art such as shown in U.S. Pat. No. 3,764,745 issued to Bottcher and Heyne; however, the combination with an amplifier providing automatic gain control for inputs between a fixed lower threshold and a fixed upper threshold, with low distortion constant gain operation for inputs above and below the threshold, has been hitherto unknown in the hearing aid art. Capacitor C4 may also be chosen to provide a frequency dependent operation of the VCR control voltage circuit with again the advantage that the operation is continuous over a wide output dynamic range due to the wide range logarithmic compression characteristic of the present circuit.

The input-output characteristics obtained with the circuit of FIG. 3 is shown in FIG. 5 for various settings of the compression ratio control potentiometer R19. Note in FIG. 5 that the lower threshold of compression, which occurs at an input signal voltage of approximately 10 microvolts, and the upper threshold of compression, which occurs at an input signal voltage of approximately 10 millivolts, are both sensibly unaffected by the setting of the compression ratio control potentiometer. Moreover, the maximum gain provided by the circuit 11 is automatically determined by the setting of the compression ratio control potentiometer so that a high compression ratio is accompanied by a high maximum preamplifier gain, and a low compression ratio is accompanied by a low maximum preamplifier gain.

In a hearing aid with commonly available electret or subminiature microphones, the lower threshold of compression corresponds to a hearing level of approximately 20 dB, while the upper threshold of compression corresponds to a hearing level of approximately 80 dB, see FIG. 4. Thus, it is seen from an analysis of FIGS. 4 and 5, that when used in a hearing aid, the circuit 11 can provide a constant maximum gain for sounds below approximately 20 dB hearing level, which sounds are typically composed largely of background noises; a smoothly decreasing gain with increasing sound intensity up to sounds corresponding to an 80 dB hearing level, and then a constant gain which may be chosen as unity acoustical gain by the proper selection of output amplifiers in the hearing aid, for sounds above 80 dB hearing level. Applicant believes that this highly desirable operation has hitherto been unavailable in any head-worn hearing aid.

FIG. 2 shows an application or connection of the inventive circuit in an overall hearing aid circuit. Resistor RB is chosen to produce the desired DC bias in the output transistor QT. Resistor RE may be chosen to produce the desired overall hearing aid gain levels; for example, RE may be chosen to produce unity acoustical gain in the hearing aid for sounds above approximately 80 dB hearing level, as discussed above. Resistor RF and capacitor CF are chosen to provide the desired output limiting as discussed above. Capacitor CR is used to control the high frequency response of the hearing aid and to insure amplifier stability. User operated potentiometer R19 controls the compression ratio in the 20 dB to 80 dB range of input hearing levels, as described above. An optional resistor R23 as shown in FIG. 3 may be used to limit the maximum gain of amplifier 11 by placing a resistance in series with VCR transistor Q4. A similar result may be obtained by increasing the value of resistor R20, thereby limiting the maximum control voltage available to VCR transistor Q4.

The circuit of FIG. 7 is a simplified version of the circuit of FIG. 3. In FIG. 7, a compression ratio of approximately 2:1 is all that is desired. Accordingly, transistor Q10, Q11 and Q12, and resistors R19 and R21 have been removed. Diode D3 has been moved from a position within the feedback loop as shown in FIG. 3, to a position where it provides a DC offset voltage in the output of the logarithmic AC amplifier. Resistors R15 and R16 are connected to form a voltage divider, with the value of resistor R16 chosen to produce the desired upper threshold of compression. A switch SW is provided and with switch SW open, resistor R23 functions somewhat like a volume control in the sense that it controls the maximum gain for low level signals. Its operation is illustrated in the curves of FIG. 8. With switch SW closed, the VCR is bypassed, so that the preamplifier 11 functions as a conventional linear amplifier with gain determined by the value of R23. It is thus possible to readily change back and forth from a conventional linear hearing aid to a wide range compression hearing aid in order to determine user preference for one type or the other in different listening situations.

It will be readily appreciated that in addition to application to hearing aids, the present circuitry will be useful in other applications where a large undistorted input dynamic range and a reduced output dynamic range are desirable. The use of low distortion wide range compression circuits is now commonplace in the recording industry, for example, as a means for reducing the effect of the noise level inherent to the recording medium. Use of such circuits has increased the quality of professional tape recorded program material. However, prior art low distortion wide dynamic range compression circuits suitable for such applications have been characterized by a power consumption which was too high to be suitable for use in miniature portable high quality tape recorders. Thus, the present circuit makes possible the application of previous automatic level control and noise reduction techniques to high quality miniature tape recorders without noticeably effecting their battery life. For such applications, it is possible to choose the circuit values to produce a maximum distortion of 1% or less throughout the entire dynamic range of the amplifiers.

While the invention has been particularly shown and described with reference to preferred embodiments thereof, it will be understood by those skilled in the art that various changes in form and details may be made therein without departing from the spirit and scope of the invention. For example, the basic circuit has been specifically designed for ease of translation into a monolithic integrated circuit.

COMPONENT LIST FOR FIG. 3

Transistors
  Q1, Q3, Q4, Q7, Q9, Q11, Q12=High Beta NPN such as Motorola MMCS 930
  Q5=Super Beta NPN such as half of Intersil IT124/D monolithic dual
  Q2, Q6, Q8, Q10, Q13—PNP such as Motorola MMCS5089 (Beta not critical in PNP transistors)
Diodes
  D1, D2, D3=gold doped silicon such as Motorola MMCD914
Resistors
  R3—680k
  R4—1.4 meg
  R5, R22—220k
  R6, R7—56k
  R8, R9—27k
  R11, R12, R13—100k
  R17—1 meg
  R16—Selected, approximately 10k
  R18—Selected, approximately 5 meg
  R19—2.5 meg potentiometer
  R20—1k
Resistors
  R21—2 meg
  R23—Optional, 100k variable
Capacitors
  C2—0.01 uf
  C3—1.0 uf
  C4—0.05 uf
  C5—0.33 uf

I claim:

1. A high fidelity head-worn hearing aid including microphone means for receiving an audio input signal and converting said audio signal to an electrical signal, variable gain amplifier and gain control circuitry receiving said electrical signal from the microphone, receiver means for receiving the electrical signal from said amplifier circuitry and converting said electrical signal to an audio signal, means for coupling said audio signal from the receiver to the ear of the user, low voltage power supply means for providing electrical power to energize said microphone means, said receiver means and said amplifier and gain control circuitry, a feedback path in said amplifier circuitry, a voltage controlled resistance means in said feedback path, logarithmic amplifier circuit means responding to the electrical signal from said microphone and providing a voltage to said voltage controlled resistance having a logarithmic relationship over a selected intermediate input signal levels and a deviation toward linear operation at higher input signal levels for providing a selected response to the intermediate input signals and a rapid decrease in the voltage provided to the voltage controlled resistance at the upper threshold of compression whereby the voltage controlled resistance means will have negligible effect on the operation of the amplifier circuitry at high signal levels and a low distortion, low noise, selected compression ratio amplifier circuitry is provided for said hearing aid.

2. A structure as in claim 1 wherein the voltage controlled resistance is effective in the circuit from below 30 up to 90 dB SPL and then becomes substantially ineffective at levels about 90 dB SPL.

3. A circuit as in claim 1 wherein the output of said logarithmic amplifier is controllable to provide a variable compression ratio.

4. A circuit as in claim 1 wherein said circuitry provides a fixed compression ratio control.

5. A circuit as in claim 1 wherein said voltage controlled resistance element is a transistor connected in grounded emitter configuration.

6. In a hearing aid, an amplifier circuit having a feedback means, a voltage controlled impedance in said feedback means, means for varying the impedance of said voltage controlled impedance in a logarithmic relation with respect to the amplitude of said output within a selected intermediate range and means for causing said impedance to have negligible effect on the operation of the circuit above selected signal levels whereby signals of low range of intensity are amplified more than signals of an intermediate range of intensity, and signals above said selected signal level obtain constant gain to thereby provide a low distortion, low noise variable compression ratio circuit.

7. A hearing aid as in claim 6 wherein voltage controlled impedance comprises a transistor, said voltage controlled impedance provides an effective amplification up to a selected level, and means for functionally disconnecting said transistor from the circuit whereby said circuit provides constant gain above said selected signal level.

8. A circuit as in claim 6 wherein said low range is from 0 to 20 dB; said intermediate range is from 20 to 80 dB and said upper range is above the level of 80 dB, all dB relative to 1 microvolt.

9. A circuit as in claim 6 further including switch means for selectively by-passing said voltage controlled resistance for changing the circuit from a linear amplifier to a selected compression ratio amplifier.

10. A high fidelity head-worn hearing aid including microphone means, variable gain amplifier and gain control circuitry for receiving a signal from the microphone, receiver means, a feedback path in said amplifier circuitry, a voltage controlled resistance means in said feedback path, a logarithmic amplifier circuit for providing a voltage to said voltage controlled resistance means having a logarithmic relationship over selected intermediate audio input signal levels, and means for increasing the resistance of said voltage controlled resistance means, the resistance of said voltage controlled resistance means being increased significantly above a selected signal level whereby the voltage controlled resistance means will be effective at the lower and intermediate signal levels and have negligible effect on the operation of the circuit at high signal levels whereby said amplifier circuitry provides amplification of the signal according to logarithmic relation up to a selected level and linear operation above said selected signal level to thereby provide a low distortion, low noise amplifier circuitry having a selected compression ratio.

11. A circuit as in claim 10 further including a field effect transistor to further attenuate high sound level outputs from the microphone.

12. A high fidelity hearing aid including a low power consumption automatic gain control amplifier suitable for operation with a miniature battery such as used with head-worn hearing aids, said automatic gain control amplifier providing automatic gain control for inputs between a fixed lower threshold voltage and a fixed upper threshold voltage and with a low distortion, fixed gain operation of the amplifier for inputs above the upper threshold and for inputs below the lower threshold.

13. An automatic gain control circuit including a feedback subcircuit, a voltage controlled impedance means comprising at least one solid state element in said feedback subcircuit, said voltage controlled impedance means providing a variable impedance up to a selected high signal level, said feedback subcircuit effecting a variable gain determined by said voltage controlled impedance means, a logarithmic amplifier means, means for rectifying the output of said logarithmic amplifier and coupling said output from said rectifying means to said solid state element to cause said element to be sensibly non-conducting above said selected signal level for increasing the impedance of said voltage controlled impedance for signals above said selected signal level to cause said voltage controlled impedance means to have negligible effect on said gain control circuit above said high signal level, whereby said automatic gain control circuit provides a preselected gain up to said signal level and essentially constant gain above said signal level and thereby obtains a low noise, variable gain amplifier circuit with low distortion at high signal levels.

* * * * *